United States Patent [19]

Trolle

[11] Patent Number: 5,457,393

[45] Date of Patent: Oct. 10, 1995

[54] METHOD AND CIRCUIT FOR BALANCING AN ERROR SIGNAL

[75] Inventor: Sten Trolle, Ystad, Sweden

[73] Assignee: Bofors AB, Karlskoga, Sweden

[21] Appl. No.: 185,963

[22] PCT Filed: Aug. 18, 1992

[86] PCT No.: PCT/SE92/00556

§ 371 Date: Feb. 8, 1994

§ 102(e) Date: Feb. 8, 1994

[87] PCT Pub. No.: WO93/04376

PCT Pub. Date: Mar. 4, 1993

[30] Foreign Application Priority Data

Aug. 19, 1991 [SE] Sweden ................................ 9102390

[51] Int. Cl.$^6$ ...................................................... H03M 1/12
[52] U.S. Cl. .......................... 324/607; 324/725; 341/156; 341/145; 341/142
[58] Field of Search ........................... 341/164, 145, 341/156, 142; 324/607, 725

[56] References Cited

U.S. PATENT DOCUMENTS

| | | | |
|---|---|---|---|
| 3,295,126 | 12/1966 | Spady | 341/164 |
| 3,493,964 | 2/1970 | Hunger | 341/164 |
| 3,686,568 | 8/1972 | MacMullan et al. | |
| 3,696,398 | 10/1972 | Pomella | 341/164 |

FOREIGN PATENT DOCUMENTS

| | | |
|---|---|---|
| 2110383 | 6/1983 | United Kingdom. |
| 2201791 | 9/1988 | United Kingdom. |

OTHER PUBLICATIONS

Patent Abstracts of Japan, vol. 8, No. 133, Feb. 1984, abstract of Japanese 59-34113.

Patent Abstracts of Japan, vol. 12, No. 245, Feb. 1988, abstract of Japanese 63-37213.

*Primary Examiner*—Kenneth A. Wieder
*Assistant Examiner*—Jose M. Solis
*Attorney, Agent, or Firm*—Sughrue, Mion, Zinn, Macpeak and Seas

[57] ABSTRACT

A circuit for balancing an error signal delivered by an apparatus. When the apparatus is switched on initially, the error signal may be large and thereafter change only slowly with time. The error signal may be a signal which is delivered by a measuring sensor and which is independent of the quantity to be measured. The circuit includes a negative feedback loop 7, 11 which, immediately upon activating or starting the apparatus, feeds back a balancing signal which rapidly compensates the error signal. The circuit also includes components 12–16 for changing the feedback loop when the error signal has been substantially compensated, so that only slow changes in the error signal with a frequency below a selected upper limit frequency are fed back.

10 Claims, 1 Drawing Sheet

METHOD AND CIRCUIT FOR BALANCING AN ERROR SIGNAL

BACKGROUND OF THE INVENTION

The present invention relates to a method of balancing an apparatus-produced error signal, which may be large when the apparatus is initially switched on, or activated, but which thereafter changes only slowly with time, particularly an error signal delivered by a measuring sensor or like measuring detector which is independent of the quantity being measured. The invention also relates to a circuit for use when carrying out the method.

The need to be able to balance an error signal which may be initially large but which, in a steady state condition, changes only very slowly with time, is found in many different contexts, one example being measuring sensors and the like which are intended to measure different quantities, these devices normally being incorporated in a measuring bridge.

It is often difficult or impractical to calibrate the measuring bridge prior to a measuring operation, and the bridge is therewith liable to produce an error signal, a so-called offset, even before it is influenced by a quantity to be measured.

In such a case, one approach is to consider all dynamic signals as useful signals. Then, by ac coupling the measuring bridge and utilizing a bottom limit frequency which is sufficiently low for the application concerned the system can be caused to measure only the desired, dynamic changes. Thus, the use of a low limit frequency makes it possible to measure also very slow changes. An ac coupled system is normally obtained by connecting capacitors between the measuring bridge and associated amplifiers.

In this case, the lower limit frequency of the measuring system is set with the aid of the time constant determined by the capacitors and resistors included in the system. One drawback with this solution, however, is that the size of the capacitors required increases with decreasing values of the lower limit frequencies. For example, if a lower limit frequency of 1 Hz is desired and reasonable resistance values are used in the amplifiers, the capacitors will be in the order of magnitude of μF. The problem will naturally increase when requiring a lower limit frequency of 0.01 Hz, for instance. However, it has been possible to solve this problem with the aid of low leakage capacitors and amplifiers with high impedances.

If the intention is to integrate such equipment on a silicon chip, however, completely new problems arise. Admittedly, capacitors and resistors can be mounted on a silicon chip in addition to transistors and diodes. However, the larger the capacitors to be produced, the more useful chip surface is taken-up, and it is also difficult technically to produce capacitors above a certain rating, normally a rating of 10–100 pF. Thus, when practicing present-day techniques, it is extremely difficult to integrate ac coupled amplifiers of low bottom-limit frequencies on a silicon chip.

One alternative to the use of an ac coupled system is to supply constantly a balancing or equalizing signal which will compensate the error signal produced by the measuring sensor. In this regard, if the bridge output signal is returned undamped through a negative feedback loop, the output signal will be constantly zero. However, the useful component of the measurement signal, when it appears, will also be balanced.

SUMMARY OF THE INVENTION

The present invention is based on the realization that this problem can be solved by making the feedback loop frequency-dependent, when the error signal to be compensated may be large immediately upon switching on or activating the apparatus, and thereafter changes only very slowly, for example as a result of system component changes which vary with temperature or time. The useful measuring signal which reflects variations in the quantity to be measured is assumed to vary more quickly than the aforesaid very slow component changes. Thus, also slow changes in the quantity can be measured, by choosing for the useful signals a low bottom limit frequency which is nevertheless higher than the slow component changes.

Accordingly, the main object of the present invention is to provide a technique which makes frequency-dependent feedback of the error signal from an apparatus possible, so that an initially large error is balanced very quickly, and whereafter continuous compensation can be obtained solely for slow changes in the error signal.

In accordance with the present invention, the method is particularly characterized in that a balancing signal which will rapidly compensate the initial error signal is delivered to the apparatus via a negative feedback loop immediately after each time the apparatus is switched on; and in that when the error signal has been substantially balanced, the feedback loop is changed so that, for as long as the apparatus is switched on or activated, only slow changes in the error signal will thereafter be fed back, with a frequency which is below an upper limit frequency that is selected in dependence on the application concerned, whereas other, useful measuring signals are delivered uninfluenced.

In accordance with one preferred embodiment of the invention, the feedback signal is delivered from a digital-to-analog converter which obtains its input signal from an up-down counter whose counting direction is determined by the polarity of the error signal. The aforesaid frequency-dependent feedback can be achieved by controlling the counter by means of a high clock frequency when initially balancing the error signal and thereafter with a lower clock frequency. Thus, the high clock frequency initially used will produce a rapidly increasing feedback signal which quickly balances the error signal, whereas the lower clock frequency used thereafter does not allow rapid changes to be taken into account in the feedback signal.

This feedback function can be achieved without the use of large capacitors and is thus well suited for silicon chip integration.

In accordance with one embodiment, the error signal is compared with a reference signal and the clock frequency is changed when the comparison shows that the error signal has been balanced. The lower clock frequency is then maintained during the time that the measuring bridge is connected or operative.

As an alternative to this comparison, the clock frequency can be changed from the higher to the lower frequency level after a predetermined length of time has lapsed after switching-on the apparatus.

BRIEF DESCRIPTION OF THE DRAWINGS

The invention will now be described in more detail with reference to an exemplifying embodiment thereof illustrated in the form of schematic block diagrams shown in the accompanying drawings.

DETAILED DESCRIPTION OF THE PREFERRED EMBODIMENTS

Figure 1:
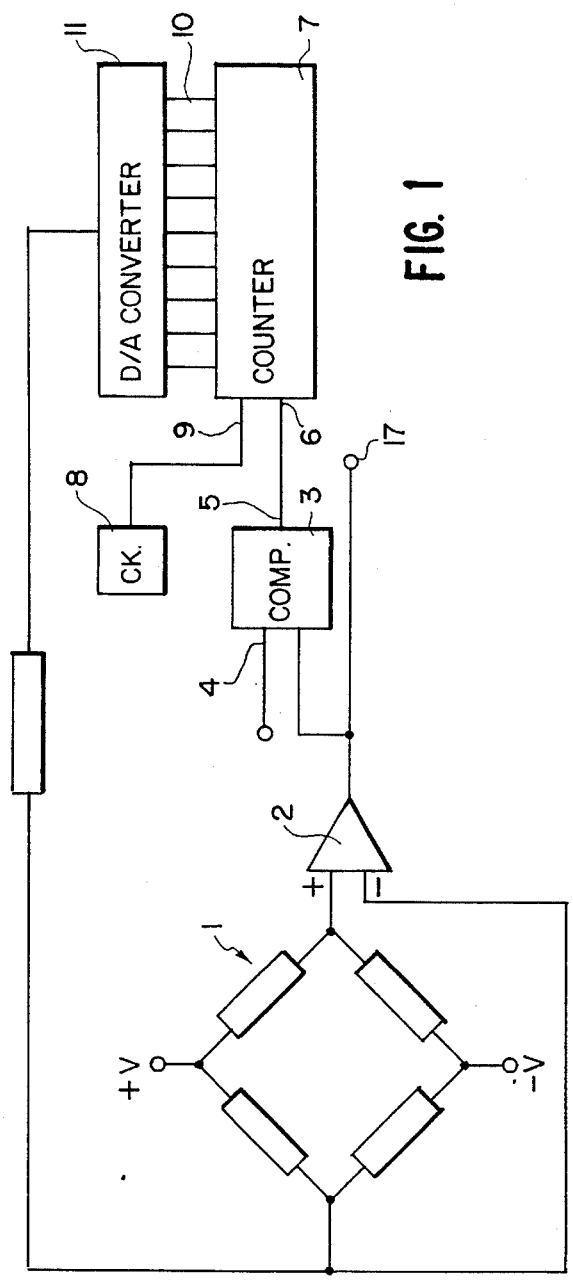
FIG. 1 illustrates a measuring bridge provided with a feedback loop in accordance with the invention, for balancing the error signal.

The apparatus illustrated in FIG. 1 includes a conventional measuring bridge 1 which is connected between the voltages +V and −V. The bridge output signal is delivered to an amplifier 2, the output signal of which, in turn, is delivered to a comparator 3 which receives a reference signal on another input 4 thereof. The comparator 3 has an output 5 which delivers a positive signal to an input 6 of a counter 7 when the output signal of the amplifier 2 is positive and larger than the reference signal on the input 4 of the comparator 3.

The apparatus also includes a clock frequency source 8 which is connected to an input 9 of the counter 7. When the aforesaid signal on the counter input 6 is positive, the counter 7 will count upwards synchronized with the clock frequency from the source 8. When the output signal of the amplifier 2 is negative, however, the comparator 3 will deliver a signal to the input 6 of the counter 7, which sets the counter so as to count down synchronized with said clock frequency.

The counter 7 has a number of binary outputs 10 which are connected to corresponding inputs of a digital-to-analog converter 11. The analog output signal of the converter 11 is returned to the negative input of the input amplifier 2.

The circuit illustrated in FIG. 1 operates in the following manner:

When the output signal of the amplifier 2 is positive and greater than the reference signal on the input 4 of the comparator 3, it delivers a positive output signal to the counter 7. As before mentioned, this causes the counter to count upwards to successively higher values synchronized with the clock frequency from the source 8, these values being converted in the digital-to-analog converter 11 to an analog signal which increases the input signal on the negative terminal of the amplifier 2. The amplifier 2 will, in this way, pass towards a balanced state. When the amplifier is set, so that its output signal becomes negative, the comparator 3 is reset to zero and the input 6 of the counter 7 is also reset to zero, whereupon the counter counts downwards and the analog feedback signal from the digital-to-analog converter 11 decreases. The amplifier 2 will then again produce a positive output signal, and so on. The counter 7 will thus count alternately upwards and downwards, so as to maintain the amplifier at its balance point.

By choosing a source 8 of a high clock frequency, the error signal applied to the amplifier 2 can be balanced very rapidly when the apparatus is initially switched on, at which time the error signal of the measuring bridge 1 can be very large.

However, subsequent to initially balancing the measuring bridge 1, none of the incoming, useful measuring signals should be compensated in conjunction with the measuring of desired quantities, these signals being delivered at the output 17. On the other hand, it is desirable to compensate for such slow changes in the error signal as those that are liable to occur as a result of component temperature changes, component aging or similar component phenomena in the measuring bridge components.

This problem can be solved by using, for steady state operation, a clock signal of lower frequency for the counter 7, meaning that measuring signals from the amplifier 2 in response to changes of the quantity to be measured at a higher frequency cannot be compensated because the speed of the counter is too low. The higher frequencies thus pass to the output 17 essentially uninfluenced by the negative feedback. In this regard, the upper limit frequency for which the circuit is able to compensate by said feedback is completely dependent on the clock frequency from the source 8. The higher the clock frequency, the more quickly the bridge is balanced and the higher the upper limit frequency becomes for signals which are compensated. Thus, by choosing a low clock frequency, it is possible to compensate only for very slowly varying error signals. A clock frequency of such low value cannot be used, how-ever, when initially balancing the bridge, since the time required herefor would be much too long for the majority of applications.

Figure 2:
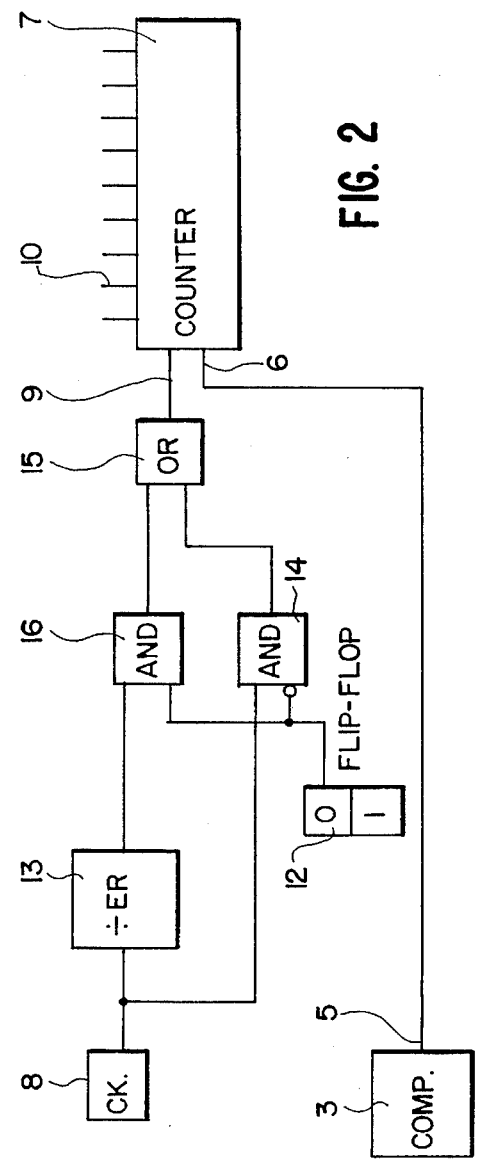
FIG. 2 illustrates the feedback loop of FIG. 1 in more detail.

FIG. 2 illustrates a further development of the feedback loop shown in FIG. 1, which is so constructed as to enable the clock frequency to be switched between a high frequency in conjunction with initial balancing of the bridge and a much lower frequency for use during staedy state operation. The same reference numerals as those used in FIG. 1 have been used in FIG. 2 to identify corresponding components. At the time of starting the apparatus, it is assumed that the counter 7 is at 0 and that flip-flop 12 is in a zero-state and that the clock signal source 8 has a frequency of, e.g, 1000 Hz. This frequency is divided in a frequency divider 13 down to a frequency of 1 Hz, for example.

When the apparatus is started, the bridge is assumed to be unbalanced, causing the comparator 3 to deliver a positive output signal, and the counter 7 begins to count upwards. The clock signal of frequency 1000 Hz therewith passes through an AND-gate 14 which has an inverting input connected to the flip-flop 12, and passes to the clock input of the counter 7 through an OR-gate 15. The counter will thus quickly count upwards and balance the error signal of the measuring bridge 1 by means of the output signal from the digital-to-analog converter 11 (see FIG. 1). The comparator 3 switches over and is set to zero immediately the amplifier 2 switches to a negative output signal, therewith changing the direction in which the counter 7 counts. When the comparator 3 is set to zero, the flip-flop 12 is also switched, therewith blocking the AND-gate 14 and opening an AND-gate 16. A clock frequency divided by 1000 will now be applied to the counter 7, through the AND-gate 16 and the OR-gate 15. The counter therewith counts down at a rate of one step/second as compared with the earlier upward count of 1000 steps/second. The flip-flop 12 remains in this state for as long as the apparatus is switched-on.

Thus, the aforedescribed coupling enables the measuring bridge 1 to be balanced very quickly when the apparatus is switched on, with the aid of a negative feedback of high frequency, and is then maintained in balance by compensating for slow changes or drift which may be due to changes in the apparatus components, as a result of the negative feedback of only low-frequency signals with a predetermined maximum highest frequency. The measuring bridge can thus also be used to measure slow signals, provided that the signals are faster than the aforesaid highest frequency, which can be given a very low value, however. This can be achieved without the use of large capacitors.

Thus, in practice, the invention enables a measuring system to be constructed with a bottom limit frequency of 0.01 Hz while using capacitors which do not exceed 0 pF. In this regard all of the aforedescribed functions can be integrated on a silicon chip without the use of any external components, which provides wide possibilities of integrating measuring sensors and adaptation-electronics in a highly miniaturized form.

Although the invention has been described in the aforegoing with reference to a preferred embodiment thereof, it will be understood that this embodiment can be modified and varied in several respects within the scope of the following claims. For example, instead of basing the clock signal change on a comparison of the error signal with a reference signal, this change may also be effected after a predetermined time has lapsed after switching on the apparatus. Furthermore, more than two levels of clock frequency may be used and activated, for instance in dependence on the size of the error signal. Instead of starting from 0, the counter may start from a minimum value which corresponds to the most probable imbalance value. This enables the time taken to achieve the initial balancing process to be further shortened. The aforesaid frequency values have been given only by way of example.

According to the aforegoing, an apparatus can be used in many contexts, such as in systems for so-called active suspension of automobiles and trains, temperature control equipment, self-calibrating weighing machines, etc.

When the requirement for small capacitors is not equally pronounced, a function corresponding to the aforedescribed function can be achieved by using a frequency-dependent negative feedback loop which includes an RC-circuit where the resistance can be short-circuited at the time of initially balancing the bridge. When the resistance is subsequently connected, there is obtained a time constant which is determined by the component values and which determines the limit frequency of these frequencies at which compensation is achieved.

I claim:

1. A method of balancing a large initial, intrinsic error signal in a measuring apparatus only when initially switching the apparatus on, said error signal thereafter changing only slowly with time, and being independent of a quantity to be measured, comprising the steps of:
    a) delivering a balancing signal to the apparatus through a negative feedback loop immediately after the apparatus is switched on, said balancing signal functioning to rapidly compensate the initial error signal; and
    b) changing the feedback loop after the initial error signal has been substantially balanced so that thereafter only slow changes in the error signal that have a frequency below a selected upper limit are fed back, while higher frequency measurement signals are output substantially unbalanced for as long as the apparatus remains switched on.

2. A method according to claim 1, wherein the feedback signal is delivered from a digital-to-analog converter having an input signal obtained from an up-down counter; and the count direction of the counter is determined by the polarity of the error signal.

3. A method according to claim 2, wherein the counter is controlled by means of a high clock frequency when initially balancing the error signal, and at a lower clock frequency thereafter.

4. A method according to claim 3, wherein the error signal is compared with a reference signal, and the clock frequency is changed when the comparison shows that the error signal has been balanced.

5. A method according to claim 4, wherein the lower clock frequency is maintained for as long as the apparatus remains switched on.

6. A method according to claim 3, wherein the clock frequency is changed subsequent to the passage of a predetermined length of time after the apparatus is switched on.

7. A circuit for balancing a large initial, intrinsic error signal in a measuring apparatus only when initially switching the apparatus on, said error signal thereafter changing only slowly with time, and being independent of a quantity to be measured, comprising:
    a) negative feedback loop means (7, 11) for immediately feeding back a balancing signal which rapidly compensates the initial error signal in response to the apparatus being switched on,
    b) means (12, 13, 16) for changing the feedback loop after the initial error signal has been substantially balanced so that thereafter only slow changes in the error signal that have a frequency below a selected upper limit are fed back for as long as the apparatus remains switched on, and
    c) output means (17) for delivering higher frequency measuring signals in a substantially unbalanced state.

8. A circuit according to claim 7, wherein the feedback loop includes a digital-to-analog converter (11) and an up-down counter (7) connected to an input of the converter, and the count direction is controlled by the polarity of the error signal.

9. A circuit according to claim 8, further comprising means (12–16) for controlling the counter with a high clock frequency during the initial balancing of the error signal, and with a lower clock frequency thereafter.

10. A circuit according to claim 9, further comprising comparison means (3) for comparing the error signal with a reference signal (4), and means for changing the clock frequency in response to the output signal of the comparison means.

* * * * *